United States Patent
Nakajima et al.

(10) Patent No.: US 6,838,197 B2
(45) Date of Patent: Jan. 4, 2005

(54) SILICA LAYERS AND ANTIREFLECTION FILM USING SAME

(75) Inventors: Tatsuji Nakajima, Tokyo-to (JP); Koji Ichimura, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 10/623,786

(22) Filed: Jul. 21, 2003

(65) Prior Publication Data

US 2004/0018362 A1 Jan. 29, 2004

Related U.S. Application Data

(62) Division of application No. 09/966,215, filed on Sep. 28, 2001, now abandoned.

(30) Foreign Application Priority Data

Sep. 29, 2000 (JP) .................................. 2000-298728
Sep. 29, 2000 (JP) .................................. 2000-298729
Nov. 2, 2000 (JP) .................................. 2000-336287

(51) Int. Cl.[7] ............................. B32B 9/00; B32B 7/02
(52) U.S. Cl. ....................... 428/698; 428/432; 428/446; 428/448; 428/212
(58) Field of Search ............................. 428/428, 429, 428/432, 446, 447, 448, 212

(56) References Cited

U.S. PATENT DOCUMENTS

| | | | | |
|---|---|---|---|---|
| 5,530,581 A | * | 6/1996 | Cogan ........................ 359/265 |
| 6,068,914 A | * | 5/2000 | Boire et al. ................. 428/212 |
| 6,165,598 A | * | 12/2000 | Nelson ........................ 428/336 |
| 6,174,599 B1 | * | 1/2001 | Boire et al. ................. 428/336 |
| 6,362,414 B1 | * | 3/2002 | Fujisawa et al. ............. 136/256 |

* cited by examiner

Primary Examiner—Stephen Stein
Assistant Examiner—G. Blackwell-Rudasill
(74) Attorney, Agent, or Firm—Ladas & Parry LLP

(57) ABSTRACT

A silica layer is provided which is usable as a low refractive index layer undergoing no change in its refractive index. Further, a silica layer is provided which is highly productive and usable as a medium or high refractive index layer undergoing neither reduction in transmittance nor change in spectral colors. Still further, an antireflection film using these silica layers is provided.

3 Claims, 3 Drawing Sheets

SILICA LAYERS AND ANTIREFLECTION FILM USING SAME

This application is a division of U.S. patent application Ser. No. 09/966,215 filed Sep. 28, 2001, abandoned.

BACKGROUND OF THE INVENTION

1. Field of the Invention

The present invention relates to a silica layer comprising an organic silicon compound and a carbon-containing silica layer containing carbon, and also to an antireflection film having an antireflection multilayered article formed of these silica layers.

2. Related Art

Transparent boards made of glass, plastic, etc. are used in various displays including liquid-crystal displays, plasma displays, and CRTs for computers, word processors, television sets, and indicating panels, etc. Such transparent boards are also used in indicators for instrumentation, etc., and rear-view mirrors, goggles, window panes,etc. When trying to read characters, symbols and other information through these transparent boards, one may have difficulty doing so due to reflection of light on their transparent surface.

To overcome this difficulty, one technique available today is to arrange an antireflection multilayered article having layers of different refractive indices superposed on a substrate film to form an antireflection film, and then to adhere the antireflection film to the surface of a transparent board, for prevention of light reflection.

It is known to be preferable to provide a small refractive index layer as the outermost layer (substantially opposite to the substrate of the antireflection film) of the antireflection multilayered article for efficient prevention of light reflection, and a silica layer is suitably used as this small refractive index layer. It is also known to be preferable to provide a plurality of layers inward of the outermost layer (i.e., between the substrate and the outermost layer of the antireflection film), which have refractive indices greater than that of the outermost layer.

However, due to the fact that the density of a silica layer is generally proportional to its refractive index, to decrease the refractive index of a silica layer used as the outermost layer, low density silica layer must be used. However, in the low density silica layer, there are many voids, and when this silica layer is used for a long period of time and/or under high temperature and high humidity, these voids are subjected to inversion of water molecules to change the reflective index of the silica layer.

Further, in many antireflection multilayered articles of conventional antireflection films, their outermost layer is formed of a silica layer, but the layers other than the outermost layer (i.e., the layers having refractive indices different from that of the outermost layer) are made from materials other than silica. For example, in many antireflection multilayered articles having a low refractive index layer, a medium refractive index layer, and a high refractive index layer superposed on a substrate film, a silica layer is used as the low refractive index layer which is the outermost layer, and titanium oxide layers are used as the medium and high refractive index layers. Further, these medium and high refractive index layers are usually formed by sputtering, etc.

SUMMARY OF THE INVENTION

Therefore, to form the conventional antireflection multi-layered articles, thin layers having different refractive indices, such as medium and high refractive index layers, need to be formed separately with using different materials, by sputtering, etc., thereby causing problems of low yield, high cost, and poor adhesion between layers.

Under these circumstances, to overcome the above problems, some medium and high refractive index layers are formed of silica layers. This is because the refractive index of a silica layer can be increased by setting x in $SiO_x$ (i.e., the number of oxygen atoms bonded to a single silicon atom) to a value smaller than 2 (stoichiometric mixture ratio), whereby the acidity of the silicon atom can be adjusted to control the refractive index of the silica layer. In this way, the use of a silica layer as a medium or high refractive index layer permits continuous formation of an antireflection film using the same raw material and system as formation of a silica layer used as a low refractive index layer.

However, when the refractive index is adjusted by setting x of $SiO_x$ forming the silica layer to a smaller value as mentioned above, absorption of light by the silica layer gradually increases in the visible range. As a result, the silica layer, when used as an optical layer, causes problems such as a reduction in transmittance and a change in spectral colors. These problems are assumed to be caused by the fact that Si—Si bonds absorbing radiation in the visible range would increase to increase the extinction coefficient of the silica layer.

It should be noted that the low refractive index layer, the medium refractive index layer, and the high refractive index layer which are thin layers for forming the antireflection multilayered article are names given to distinguish one layer from others when they are compared relatively in terms of their index of refraction. A layer having a comparatively high refractive index is denoted as a high refractive index layer, a layer having a comparatively low refractive index as a low refractive index layer, and a layer having a refractive index between those of the high and low refractive index layers as a medium refractive index layer. Generally, layer having a refractive index of 1.80 or more may be high refractive index layer, layer having a refractive index between 1.55 and less than 1.80 may be medium refractive index layer, and layer having a refractive index of less than 1.55 may be low refractive index layer. Therefore, these names are used in the above sense throughout this specification.

The present invention has been accomplished under the above problems, and a first object thereof is to provide a silica layer usable as a low refractive index layer, whose low refractive index undergoes no change even when used for a long period of time and under high temperatures and high humidities.

Further, a second object of the present invention is to provide a silica layer usable as a medium refractive index layer or a high refractive index layer, which is a thin layer for use in the antireflection multilayered article of an antireflection film, which is formable from a silicon compound that is the same raw material as that of a known silica layer as the outermost layer, highly productive, and undergoing no reduction in transmittance and no change in spectral colors.

Still further, a third object of the present invention is to provide an antireflection film exhibiting high productivity and excellent transparency and antireflection characteristics.

To achieve the above objects, a silica layer according to the present invention comprises an organic silicon compound, which has a refractive index of not less than 1.40 and not more than 1.46 ($\lambda$=550 nm), and whose composition is represented by $SiO_xC_y$: H (x=1.6 to 1.9, y=0.2 to 1.0) (hereinafter, referred to as "silica layer (A)" whenever applicable).

When the refractive index of the silica layer is set to any value within the above range, the silica layer can be used as a low refractive index layer exhibiting excellent optical properties, and can thus be utilized as the outermost layer, etc. of an antireflection multilayered article in an antireflection film. Further, when the silica layer comprises an organic silicon compound having a composition represented by $SiO_xC_y$: H (x=1.6 to 1.9, y=0.2 to 1.0), the silica layer contains a linkage with an organic group such as a methyl group ($CH_3$—), in addition to the silicon atom (Si) and the oxygen atoms (O), which are its essential constituents. As a result, the silica layer can have a low refractive index.

To decrease the refractive index, voids had to be provided in the conventional silica layers to decrease their density. As a result, these silica layers allow the inversion of water molecules into the voids when used for a long period of time and/or under high temperatures and humidities, and this would in turn change their refractive index. However, since the silica layer of the present invention comprises an organic silicon compound, its refractive index can be decreased by controlling its composition. Therefore, there is no need to provide voids in the silica layer, and thus the refractive index of the silica layer undergoes no change even when the silica layer is used for a long period of time and/or under high temperatures and humidities.

A silica layer of the present invention as one preferred embodiment may be that has an infrared absorption due to C—H stretching vibrations in the range 0.1–1 $cm^{-1}$ and infrared absorption due to O—H stretching vibrations in the range 1–30 $cm^{-1}$.

The silica layer having such an absorption spectrum as above could exhibit the above-mentioned property of the present invention (the ability of a silica layer to have a low refractive index without providing voids therein, due to the fact that the silica layer is made of an organic silicon compound) more effectively.

Further, a silica layer of the present invention as another preferred embodiment has a change in its refractive index by 0.01 or less after a humidity/heat resistance test.

Here, the humidity/heat resistance test means a test in which a silica layer is stood at 80° C. and 90% relative humidity for 1000 hours. The refractive index of the silica layer of the present invention can possess a change by 0.01 or less even after the test. Therefore, the silica layer which expresses such a moderate change with respect to the refractive index after the test would be sufficiently practicable.

A silica layer of the present invention as another preferred embodiment is a layer which is formed by a plasma CVD method using an organic silicone as raw material.

The plasma CVD method permits comparatively easy control over the conditions for forming the silica layer of the present invention. Also, as a feature, the silica layer of the present invention comprises an organic silicon compound. To form a layer from such a raw material containing an organic ingredient, the plasma CVD method using gaseous raw materials is most preferable.

Further, to achieve the above objects, a silica layer according to the present invention comprises carbon-containing silica layer, and has a refractive index of not less than 1.55 and less than 1.80 (λ=550 nm), and a composition represented by $SiO_aC_b$ (a=0.7 to 1.7, b=0.2 to 1.4) (hereinafter referred to as "silica layer (B)" whenever applicable).

When the refractive index of the silica layer is set to a value within the above range, the silica layer can be suitably used as a medium refractive index layer in the antireflection multilayered article of an antireflection film. Also, the composition of the silica layer is represented by above, whereby the silica layer can have a desired refractive index (not less than 1.55 and less than 1.80 (λ=550 nm)). As a result, when used as one of the layers forming the antireflection multilayered article of an antireflection film, the silica layer, because of its being similar to the silica layer as a low refractive index layer of the antireflection multilayered article, can improve yield and reduce cost in forming the antireflection multilayered article.

A silica layer of the present invention as one preferred embodiment is such that the ratio of Si—Si bonds to all Si atoms' bonds in the layer is 1% or less.

When the refractive index of the silica layer is adjusted by setting x of $SiO_x$ to a smaller value in order to form a silica layer as a medium refractive index layer in the known technique, the proportion of the Si—Si bonds grows larger within the layer, thereby causing the silica layer to gradually increase the absorption of light in the visible range and to sometimes reduce its transmittance and change its spectral colors. However, when the ratio of Si—Si bonds to all Si atoms' bonds in the silica layer is confined to 1% or less, the layer is assumed to contain few Si—Si bonds, thus making itself hardly influenced by optical absorption due to the Si—Si bonds. As a result, its extinction coefficient can be set to 0.018 (λ=550 nm) or less.

It should be noted that the extinction coefficient means an imaginary number of a complex refractive index, which is calculated from the equation $h=\alpha\lambda/4\pi$ (wherein α is the absorption coefficient and λ is the wavelength of light). The smaller its extinction coefficient, the better its transparency.

Further, a silica layer of the present invention as another preferred embodiment is formed by a plasma CVD method using an organic silicone as raw material.

The plasma CVD method permits comparatively easy control over the conditions for forming the silica layer of the present invention. Further, when an organic silicone is used as a raw material for forming the silica layer of the present invention by the plasma CVD method, the silica layer can be formed efficiently.

A silica layer of the present invention as one preferred embodiment is carbon-containing silica layer, and which has a refractive index of not less than 1.80 and not more than 2.50 (λ=550 nm), and has composition represented by $SiO_dC_e$ (d=0.5 to 0.9, e=1.0 to 2.0) (hereinafter, referred to as "silica layer (C)" whenever applicable).

When the refractive index of the silica layer is set within the above range, the silica layer can be suitably used as a high refractive index layer in the antireflection multilayered article of an antireflection film. Also, when the composition of the silica layer can be represented by above, the silica layer can have a desired refractive index (from 1.80 to 2.50 (λ=550 nm)).

Further, a silica layer of the present invention as another preferred embodiment is such that the ratio of Si—Si bonds to all Si atoms' bonds in the layer is 1% or less.

When the refractive index of the silica layer is adjusted by setting x of $SiO_x$ to a smaller value in order to form a silica layer as a medium refractive index layer in the known technique, the proportion of the Si—Si bonds grows larger within the layer, thereby causing the silica layer to gradually increase the absorption of light in the visible range, and to sometimes reduce its transmittance and change its spectral colors. However, when the ratio of Si—Si bonds to all Si atoms' bonds in the silica layer is regulated to 1% or less, the layer is assumed to contain few Si—Si bonds, thus making itself hardly influenced by optical absorption due to the Si—Si bonds. As a result, its extinction coefficient can be set to 0.018 ($\lambda$=550 nm) or less.

Further, a silica layer of the present invention as another preferred embodiment is the layer which is formed by a plasma CVD method using an organic silicone as raw material.

The plasma CVD method permits comparatively easy control over the conditions for forming the silica layer of the present invention. Further, by using an organic silicone as a raw material for forming the silica layer of the present invention by the plasma CVD method, the silica layer can be formed efficiently.

An antireflection film of the present invention as one preferred embodiment comprises at least a substrate film and an antireflection multilayered article provided on the substrate film, the antireflection multilayered article containing any of the silica layer (A), the silica layer (B), and the silica layer (C).

Since the antireflection multilayered article is formed of any of the silica layer (A), the silica layer (B), and the silica layer (C), the antireflection film can be provided with an excellent antireflection function.

Further, an antireflection film of the present invention as another preferred embodiment comprises at least a substrate film and an antireflection multilayered article provided on the substrate film, wherein the outermost layer of the antireflection multilayered article is the silica layer (A), and wherein at least one of the silica layer (B) and the silica layer (C) is formed as layer(s) located inwardly from the outermost layer.

The antireflection film of the present invention uses the silica layer (A) (the silica layer composed of an organic silicon compound) as the outermost layer of its antireflection multilayered article, i.e., as the layer provided at the side opposite to the another side faced to the substrate in the antireflection multilayered article. Thus, by forming the outermost layer of the low refractive index silica layer, the silica layer contains linkages to organic groups such as a methyl group ($CH_3$—), in addition to the linkages between silicon atoms (Si) and oxygen atoms (O) which are essential constituents of silica layer, and hence can have a low refractive index.

Further, an antireflection film of the present invention is formed of at least one of the silica layer (B) and the silica layer (C) (the carbon-containing silica layers) as a layer located inwardly from the outermost layer, i.e., as a layer interposed between the substrate and the outermost layer in the antireflection multilayered article. This is because the carbon-containing silica layer can have a larger refractive index than the organic silicon compound used as the outermost layer of the antireflection multilayered article, and thus the carbon-containing silica layer can be suitably used as the layer located inwardly from the outermost layer, i.e., as a medium or high refractive index layer when the outermost layer is formed of a low refractive index layer. Also, when this silica layer is used as a medium or high refractive index layer, all layers in the antireflection multilayered article can be formed by silica layers, including the outermost layer, whereby the transparency of the entire antireflection multilayered article and adhesion between layers can be improved.

Further, an antireflection film of the present invention as another preferred embodiment comprises at least a substrate film and an antireflection multilayered article superposed on the substrate film, the antireflection multilayered article comprising the silica layer (B), the silica layer (C), and the silica layer (A), in order from the side of the substrate.

Further, an antireflection film of the present invention as another preferred embodiment comprises at least a substrate film and an antireflection multilayered article superposed on the substrate film, the antireflection multilayered article comprising the silica layer (C), the silica layer (A), the silica layer (C), and the silica layer (A), in order from the side of the substrate.

When the layers of the antireflection multilayered article are comprised as mentioned above, the antireflection multilayered article can perform the antireflection function efficiently as a whole.

DETAILED DESCRIPTION OF THE PREFERRED EMBODIMENTS

Silica Layers

Figure 1:
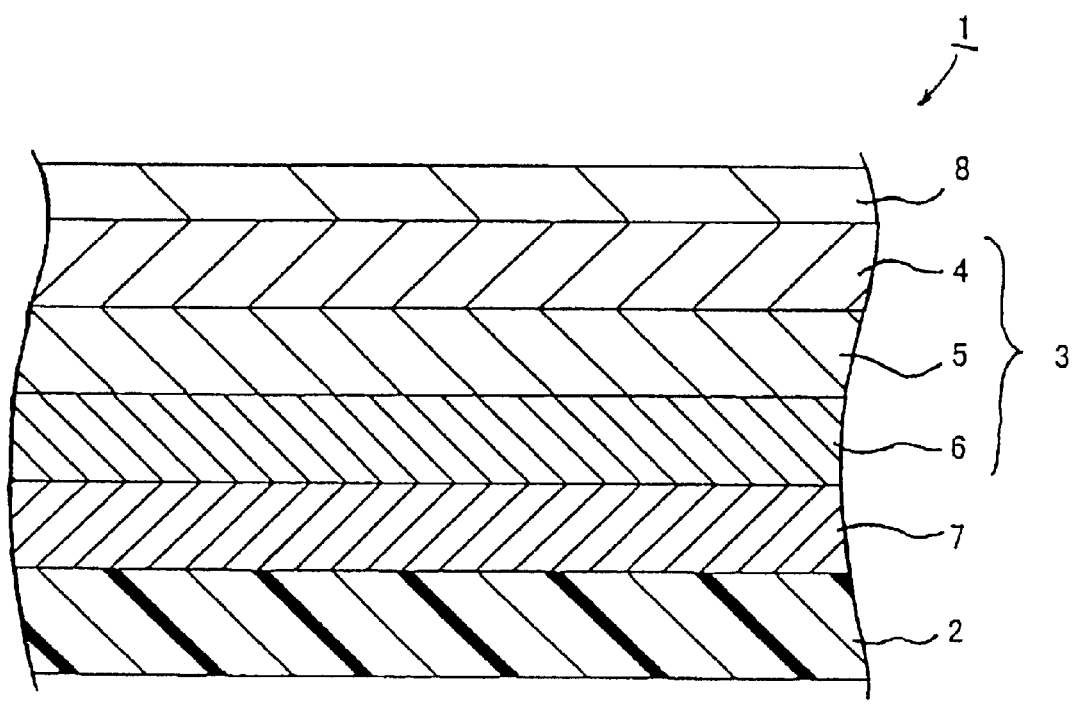
FIG. 1 is a schematic sectional view showing an example of an antireflection film of the present invention.

Three types of silica layers of the present invention will now be described. The three types of silica layers of the present invention are:

<1> a silica layer comprising an organic silicon compound and functioning as a low refractive index layer;

<2> a silica layer containing carbon and functioning as a medium refractive index layer; and <3> a silica layer containing carbon and functioning as a high refractive index layer.

<1> Silica Layer Comprising an Organic Silicon Compound and Functioning as a Low Refractive Index Layer A silica layer comprising an organic silicon compound, which is one type of silica layer of the present invention, has features enumerated below.

(1) Its refractive index ranges from 1.40 to 1.46, and its composition is represented by $SiO_xC_y$: H (x=1.6 to 1.9, y=0.2 to 1.0).
(2) Its infrared absorption due to C—H stretching vibrations is in the range 0.1–1 $cm^{-1}$, and its infrared absorption due to O—H stretching vibrations is in the range 1–30 $cm^{-1}$.
(3) Its refractive index undergoes a change by 0.01 or less after a humidity/heat resistance test.

The above features (1) to (3) will be described concretely.
Feature (1):
The silica layer composed of an organic silicon compound of the present invention has the feature that its refractive index ranges from 1.40 to 1.46 and that its composition is represented by $SiO_xC_y$: H (x=1.6 to 1.9, y=0.2 to 1.0).

As to the silica layer composed of an organic silicon compound of the present invention, because of its main intended use as the outermost layer of an antireflection multilayered article of which an antireflection film is made together with a substrate, the smaller its refractive index, the more desirable it is. If its refractive index is within the above range, the silica layer composed of an organic silicon compound of the present invention can be used as a low refractive index layer, and hence as the outermost layer of the antireflection multilayered article.

Also, the composition of this silica layer is represented by $SiO_xC_y$: H (x=1.6 to 1.9, y=0.2 to 1.0). That is, the silica layer is not a layer comprising simple silicon oxide ($SiO_x$), but a layer comprising a silicon compound containing organic moiety(containing carbon (C) and hydrogen (H)) (i.e., an organic silicon compound).

Here, the numeral x of oxygen atoms (O) bonded to the silicon atom (Si) in the silica layer ranges from 1.6 to 1.9. This is because, when the numeral x greater than 1.6, the refractive index of the silica layer increases so as to disqualify the silica layer as a low refractive index layer and hence make it unsuitable for the outermost layer of the antireflection multilayered article in the antireflection film. On the other hand, it may be impossible to increase the number x in excess of 1.9 in terms of the atomic structure of silicon. Therefore, in this silica layer, the number x of oxygen atoms (O) bonded to the silicon atom (Si) is set to 1.6 to 1.9.

Further, the numeral y of carbon atoms (C) bonded to the silicon atom (Si) in this silica layer ranges from 0.2 to 1.0. The reason is as follows. When the numeral of carbon atoms is smaller than 0.2, it is impossible to decrease amply the refractive index of the silica layer only by its inherent composition. As the result in such case, to decrease the refractive index (i.e., to form the silica layer as a low refractive index layer) so that the silica layer can be used as the outermost layer of the antireflection multilayered article, voids must be provided in the silica layer. When the silica layer containing voids is used under high temperature, high humidity, etc., its refractive index does change (its refractive index increases), and hence such a silica layer is not suitable to achieve the objects of the present invention. On the other hand, if the numeral y is increased in excess of 1.0, the silica layer thus formed becomes brittle as a whole, making it impossible to form the layer itself.

Thus, the silica layer is formed using an organic silicon compound so that its refractive index ranges from 1.40 to 1.46 and so that its composition is represented by $SiO_xC_y$: H (x=1.6 to 1.9, y=0.2 to 1.0), whereby the silica layer can have a low refractive index without need for providing voids therein. Therefore, the refractive index of the silica layer undergoes no change even when the silica layer is used for a long period of time and/or under high temperature and high humidity. Further, due to its low refractive index, the silica layer can be suitably used as the outermost layer of the antireflection multilayered article in the antireflection film.

Feature (2):

This silica layer has the feature that its infrared absorption due to C—H stretching vibrations is in the range 0.1–1 $cm^{-1}$, and that its infrared absorption due to O—H stretching vibrations is in the range 1–30 $cm^{-1}$.

As mentioned above, this silica layer includes bondings to the organic moiety (carbon (C) and hydrogen (H)), in addition to the bondings between silicon atoms (Si) and the oxygen atoms (O). In this silica layer, the structure of organic moiety to be bonded is not limited. Any organic residue having any structure may be acceptable, as long as the resultant refractive index of the silica layer as a whole is in the 1.40–1.46 range and its composition satisfies the above-mentioned range.

However, of any silica layer having the composition satisfying the range mentioned in (1) above, particularly, a silica layer exhibiting an infrared absorption due to C—H bond stretching vibrations in the 0.1–1 $cm^{-1}$ range and an infrared absorption due to O—H bond stretching vibrations in the 1–30 $cm^{-1}$ range is preferable, and further a silica layer exhibiting an infrared absorption due to C—H bond stretching vibrations in the 0.3–1 $cm^{-1}$ range and an infrared absorption due to O—H bond stretching vibrations in the 3–15 $cm^{-1}$ range is more preferable.

Here, the above infrared absorptions are measured by a known transmission type IR spectroscopy, and the value of $\int (\alpha/f)\, df$ in the infrared absorption due to each type of stretching vibrations is caluculated (wherein $\alpha$ is the absorption coefficient and f is the frequency). The infrared absorption due to C—H bond stretching vibrations is caluculated from an read absorbance at the wave number range 2800–3100 $cm^{-1}$ in obtained absorption spectrum. The infrared absorption due to O—H bond stretching vibrations is caluculated from an read absorbance at the wave number range 3000–3800 $cm^{-1}$ in obtained absorption spectrum.

It is obvious that any silica layer in which its infrared absorption due to C—H bond stretching vibrations and its infrared absorption due to O—H bond stretching vibrations are within the above ranges includes bonds to organic moieties, and hence it can be said that such a silica layer has a low refractive index as well as humidity/heat resistance.

Feature (3):

This silica layer has the feature that its refractive index undergoes a change by 0.01 or less after a humidity/heat resistance test.

Here, the humidity/heat resistance test according to the present invention is carried out by standing a silica layer in an environmental test machine at 80° C. and 90% relative humidity for 1000 hours.

Since this silica layer has characteristics such as mentioned above, its refractive index underwent a change by 0.01 or less when a comparison was made with respect to the refractive index before and after the test, and hence it can be said that the silica layer would be sufficiently practicable.

<2> Silica Layer Containing Carbon and Functioning as a Medium Refractive Index Layer Next, a silica layer containing carbon and functioning as a medium refractive index layer, which is one type of the silica layer of the present invention, will be described.

The silica layer of the present invention which contains carbon and functions as a medium refractive index layer has features enumerated below.

(1) Its refractive index is not less than 1.55 and less than 1.80 ($\lambda$=550 nm), and its composition is represented by $SiO_aC_b$ (a=0.7 to 1.7, b=0.2 to 1.4).
(2) The ratio of Si—Si bonds to all Si atoms' bonds in the layer is 1% or less.

The above features (1) and (2) will be described specifically.

Feature (1):

The carbon-containing silica layer of the present invention has the feature that its refractive index ranges from 1.55 to less than 1.80 ($\lambda$=550 nm), and that its composition is represented by $SiO_aC_b$ (a=0.7 to 1.7, b=0.2 to 1.4).

As to the carbon-containing silica layer of the present invention, because of its main intended use as a medium refractive index layer of an antireflection multilayered article of which an antireflection film is made together with a substrate, it is preferable that its refractive index ranges from 1.55 to less than 1.80($\lambda$=550nm). Therefore, by setting the refractive index within the above range, the carbon-containing silica layer of the present invention can be used as a medium refractive index layer in the antireflection film.

Further, the composition of this silica layer is represented by $SiO_aC_b$ (a=0.7 to 1.7, b=0.2 to 1.4). That is, the silica layer is not a layer composed of simple silicon oxide ($SiO_x$), but is a carbon (C) containing silica layer. Thus, due to the possessing of carbon component, the silica layer can have a desired refractive index.

Here, the numeral a of oxygen atoms (O) in this silica layer ranges from 0.7 to 1.7. This is because the numeral of bonded oxygen atoms smaller than 0.7 would make the refractive index of this silica layer so large that the silica layer is no longer a medium refractive index but will become a high refractive index layer. On the other hand, the numeral of oxygen atoms greater than 1.7 reduces its refractive index to that (1.46 to 1.47) of a simple silica layer ($SiO_2$), thereby making this silica layer unsuitable for a medium refractive index layer for forming the antireflection multilayered article.

Further, the numeral b of carbon atoms (C) in this silica layer ranges from 0.2 to 1.4. This is because the numeral of carbon atoms in the silica layer smaller than 0.2 reduces its refractive index to that (1.46 to 1.47) of the simple silica layer ($SiO_2$), thereby making this silica layer unsuitable for a medium refractive index layer for forming the antireflection multilayered article. On the other hand, the numeral of carbon atoms greater than 1.4 would make the refractive index of this silica layer so large that the silica layer is no longer a medium refractive index but will become a high refractive index layer.

Feature (2):

This silica layer containing carbon has the feature that the ratio of Si—Si bonds to all Si atoms' bonds in the layer is 1% or less.

This is because the Si—Si bonds in the silica layer absorb light in the visible range and an abundance of these bonds would reduce the light transmittance of the layer and/or change its spectral colors. Here, "the ratio of Si—Si bonds to all Si atoms' bonds" refers to the percentage of Si—Si bonds in all of Si—Si bonds, Si—O bonds and Si—C bonds.

In the present invention, the percentage of Si—Si bonds in the silica layer is obtained based on waveform separation in electron spectroscopy. Specifically, the percentage was obtained by measuring a Si(2p) spectrum using an photoelectron spectrometer (ESCALAB 220i-XL manufactured by VG Scientific) under the following conditions. It should be noted that the measurement was made after etching the silica layer to about several nanometers using Ar ions, through correction of bonding energy was done so as to the 1s peak of C—C bond is 284.6 eV. Further, the spectrum was subjected to waveform separation using the Si—O binding energy of 103.5 eV, the Si—Si binding energy of 99.0 eV, and the Si—C binding energy of 100.5 eV.

(Measurement Conditions)

X-ray source: Monochromatized Al $K_\alpha$ radiation
X-ray output: 10 kV, 20 mA
Area for measurement: 0.7 mm in diameter
Escape depth of photoelectron: 90°

<3> Silica Layer Containing Carbon and Functioning as a High Refractive Index Layer.

Next, a silica layer containing carbon and functioning as a high refractive index layer, which is one type of silica layer of the present invention, will be described.

The silica layer of the present invention containing carbon and functioning as a high refractive index layer has features enumerated below.

(1) Its refractive index ranges from 1.80 to not more than 2.50 (λ=550 nm), and its composition is represented by $SiO_dC_e$ (d=0.5 to 0.9, e=1.0 to 2.0).
(2) The ratio of Si—Si bonds to all Si atoms' bonds in the layer is 1% or less.

The above features (1) and (2) will be described specifically.

Feature (1):

The carbon-containing silica layer of the present invention has the feature that its refractive index is not less than 1.80 and not more than 2.50 (λ=550 nm), and that its composition is represented by $SiO_dC_e$ (d=0.5 to 0.9, e=1.0 to 2.0).

As to the carbon-containing silica layer of the present invention, because of its main intended use as a high refractive index layer of an antireflection multilayered article of which an antireflection film is made together with a substrate, it is preferable that its refractive index is not less than 1.80 and not more than 2.50 (λ=550 nm). Therefore, by setting the refractive index within the above range, the carbon-containing silica layer of the present invention can be used as a high refractive index layer in the antireflection film.

Further, the composition of this silica layer is represented by $SiO_dC_e$ (d=0.5 to 0.9, e=1.0 to 2.0). That is, the silica layer is not a layer composed of simple silicon oxide ($SiO_x$), but a carbon (C) containing silica layer. Thus, due to the possessing of carbon component, the silica layer can have a desired refractive index.

Here, the numeral d of oxygen atoms (O) in the silica layer ranges from 0.5 to 0.9. This is because the numeral of oxygen atoms smaller than 0.5 increases the percentage of a silicon atom (Si) bonding to another silicon atom (Si), i.e., the percentage of Si—Si bonds, thereby increasing the extinction coefficient, and as a result, the transparency of the silica layer is impaired to make the silica layer unsuitable for one of the layers in the antireflection multilayered article of the antireflection film. On the other hand, the numeral of oxygen atoms greater than 0.9 would decrease the refractive index so that the silica layer will become a medium refractive index layer.

Further, the numeral e of carbon atoms (C) in this silica layer ranges from 1.0 to 2.0. This is because the numeral of carbon atoms smaller than 1.0 would decrease the refractive index so that the silica layer will become a medium refractive index layer. On the other hand, the numeral of carbon atoms greater than 2.0 impairs the transparency of the silica layer to make the silica layer unsuitable for one of the layers in the antireflection multilayered article of the antireflection film. In addition, the internal stress of the silica layer grows larger, leading to cracking and delamination of the silica layer.

Feature (2):

This carbon-containing silica layer has the feature that the ratio of Si—Si bonds to all Si atoms' bonds in the layer is 1% or less.

Since this feature is similar to that of the aforesaid silica layer containing carbon and functioning as a medium refractive index layer, its description is omitted here.

Antireflection Film

Next, an antireflection film made of the above-described three types of silica layers of the present invention will be described.

FIG. 1 is a schematic sectional view showing an example of an antireflection film of the present invention. As shown in FIG. 1, the antireflection film 1 comprises a substrate 2 and an antireflection multilayered article 3. Depending on the predetermined use, etc. of the antireflection film 1, a hard coating layer 7 may be interposed between the, substrate 2 and the antireflection multilayered article 3, or a stainproof layer 8, etc. may be provided on the antireflection multilayered article 3.

The components of the antireflection film 1 of the present invention will be described in detail below.

<1> Antireflection Multilayered Article

The antireflection multilayered article 3 in the antireflection film 1 of the present invention is characterized by the fact of containing any of the silica layer composed of an organic silicon compound described in <1> above, the carbon-containing silica layer described in <2> above, and the carbon-containing silica layer described in <3> above. Therefore, in the antireflection multilayered article of the antireflection film of the present invention, as long as the multilayered article 3 contains one of the silica layer composed of an organic silicon compound described in <1> above, the carbon-containing silica layer described in <2> above, and the carbon-containing silica layer described in <3> above, it is not necessary to form the entire antireflection multilayered article of these silica layers. As the high refractive index layer, for example, a titanium oxide layer may be used. As the medium refractive index layer, for example, any layer formed by dispersing fine particles of $Al_2O_3$, SiN, SiON, $ZrO_2$, $SiO_2$, or $ZnO_2$ into an organic silicon compound, etc. may also be used. Further, it is not necessary to provide single medium refractive index layer 6, but a plurality of different layers may be layered to provide a medium refractive index layer that has the above-mentioned refractive index as a whole. Still further, as the low refractive index layer, any layer of $SiO_2$, $MgF_2$, etc. may be used.

This is because, by forming the above-mentioned three types of silica layers of the present invention in the antireflection multilayered article, each of these silica layers yields such positive effects as to form an excellent antireflection film. In this case, it is preferable to use the silica layer composed of an organic silicon compound described in <1> above as a low refractive index layer for the outermost layer of the antireflection multilayered article. It is preferable to use the carbon-containing silica layer described in <2> above as a medium refractive index layer. Further, it is preferable to use the carbon-containing silica layer described in <3> above as a high refractive index layer.

The antireflection multilayered article 3 in the antireflection film 1 of the present invention shown in FIG. 1 has a feature that a silica layer 4 composed of an organic silicon compound of the present invention (the silica layer described in <1> above) is formed as its outermost layer, and that at least one of the silica layers respectively containing carbon and functioning as medium and high refractive index layers (the silica layers denoted by reference numerals 6 and 5 in FIG. 1 and described in <2> and <3> above) is formed the layer located inwardly from the outermost layer. Here, the outermost layer of the antireflection multilayered article 3 means a layer arranged at the outermost location in the antireflection multilayered article 3 formed of optical layers (layers formed to prevent reflection), i.e., the layer located opposite to the substrate 2. Here, the antireflection multilayered article 3 does not contain any other layers than the optical layers, the other layers being the hard coating layer 7 and the stainproof layer 8, for example.

The outermost layer of the antireflection multilayered article 3 in the antireflection film 1 is formed of the silica layer 4 composed of an organic silicon compound, whereby the outermost layer can have a small refractive index. Further, the carbon-containing silica layers 5 and 6 are formed inward of the silica layer 4, whereby these layers 5 and 6 can be suitably used as high and medium refractive index layers in the antireflection multilayered article.

How the layers are arranged in the antireflection multilayered article of the antireflection film of the present invention is not particularly limited, as long as the outermost layer is a silica layer composed of an organic silicon compound, or at least one of carbon-containing silica layers is formed as an internal layer. These layers may be layered as one desires so as to provide antireflection effects.

Among others, it is preferable to arrange the layers of the antireflection multilayered article of the present invention as shown in FIG. 1. That is, for the outermost layer, the silica layer 4 composed of an organic silicon compound is used as a low refractive index layer; for the layer directly thereunder (the layer next to the outermost layer in the direction of the substrate), the above-mentioned carbon-containing silica layer 5 is used as a high refractive index layer; and for the layer directly under the high refractive index layer, the carbon-containing silica layer 6 is used as a medium refractive index layer.

Figure 2:
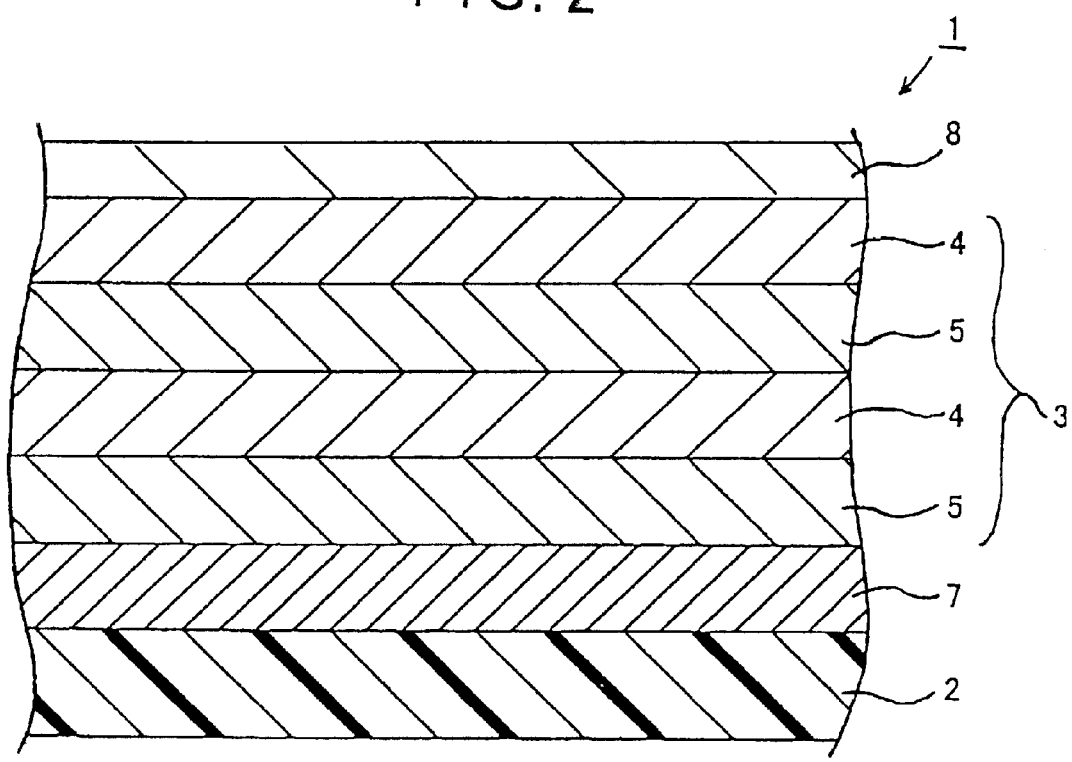
FIG. 2 is a schematic sectional view showing another example of an antireflection film of the present invention.

It is also preferable to arrange the layers of the antireflection multilayered article as shown in FIG. 2. That is, for the outermost layer, the silica layer 4 composed of an organic silicon compound is used as a low refractive index layer; for the layer directly thereunder (the layer next thereto in the direction of the substrate), the above-mentioned carbon-containing silica layer 5 is used as a high refractive index layer; and for the layer directly under the high refractive index layer, the silica layer 4 composed of an organic silicon compound is used; and for the layer directly thereunder, the carbon-containing silica layer 5 is used as a high refractive index layer.

This is because, by arranging the layers of the antireflection multilayered article 3 as mentioned above, antireflection can be achieved efficiently, and all layers in the antireflection multilayered article can be formed of silica layers, whereby adhesion between layers can be improved.

The thickness of the silica layer 4 composed of an organic silicon compound used as a low refractive index layer is not particularly limited, but any thickness may be acceptable as long as antireflection effects can be provided. However, in general, thicknesses in the 10–1000 nm range are preferable, and thicknesses in the 50–150 nm range are particularly preferable, because thicknesses thinner than the above would be ineffective to provide antireflection effects, and thicknesses thicker than the above would embrittle the entire layer to impair its film-formability.

Further, the thickness of the carbon-containing silica layer 5 used as a high refractive index layer is not particularly limited, either, and any thickness may be acceptable as long as antireflection effects can be provided. Among others, thicknesses in the 0.005–0.3 $\mu$m range are particularly preferable, and thicknesses in the 0.01–0.15 $\mu$m range are more preferable,in general. Because thicknesses thinner than 0.005 $\mu$m provide little antireflection effects, and thicknesses thicker than 0.3 $\mu$m cause deformation of the substrate and delamination of the layer due to stresses of the layer.

Still further, as to the carbon-containing silica layer 6 used as a medium refractive index layer, thicknesses in the 0.005–0.3 $\mu$m range are particularly preferable, and thicknesses in the 0.01–0.15 $\mu$m range are more preferable for a similar reasons as mentioned above as to a high refractive index layer.

<2> Substrate

Next, the substrate 2 will be described. In the antireflection film 1 of the present invention, the substrate 2 is located opposite to the antireflection multilayered article 3, and provides the base portion for the antireflection film 1. The substrate 2 is not particularly limited, as long as it may be any high molecular material film which is transparent in the visible range.

The high molecular material film includes triacetylcellulose film, diacetylcellulose film, cellulose acetate butylate film, polyether sulfone film, polyacrylic film, polyurathane film, polyester film, polycarbonate film, polysulfone film, polyether film, trimethylpentene film, polyetherketone film, acrylonitrile film, and methacrylonitrile film. Further, colorless film may be more preferably used. Among others, uniaxially or biaxially stretched polyester film is suitably used because of its good transparency and heat resistance. Particularly, polyethylene terephthalate (PET) film is preferable. Also, triacetylcellulose is suitably used due to the absence of optical anisotropy. The high molecular material film typically of about 6–188 μm in thickness is suitably used.

<3> Hard Coating Layer

Still further, in the antireflection film 1 of the present invention, the hard coating layer 7 may also be arranged, in addition to the previously mentioned antireflection multilayered article 3 and substrate 2.

The hard coating layer 7 used in the present invention is formed in order to give mechanical strength to the antireflection film 1. Therefore, this layer 7 is not always necessary, depending on the intended use of the antireflection film 1.

The material for the hard coating layer 7 is not particularly limited, as long as it is similarly transparent in the visible range and can give strength to the antireflection film. For example, a UV cure acrylic hard coating or a thermoset silicone hard coating may be used. Further, the thickness of this hard coating layer is typically in the 1–30 μm range, and such a hard coating layer 7 can be manufactured by any ordinary coating method and which is not particularly limited.

Further, the hard coating layer 7 is preferably arranged at a location separated from the silica layer 4 composed of an organic silicon compound as the outermost layer, and thus preferably located directly on the substrate 2, because it is arranged to give strength to the antireflection film 1, not to improve the antireflection function.

<4> Other Layers

In the antireflection film 1 of the present invention, other layers may be arbitrarily superposed, depending on the desired use, etc. of the antireflection film, in addition to the previously mentioned antireflection multilayered article 3, substrate 2, and hard coating layer 7.

For example, when the antireflection film is used at the display of a computer, the stainproof layer 8 may be provided for protection of the display surface from dirt. The stainproof layer 8 may be made from a fluoroalkyl group-containing organic silicon compound, an alkyl group-containing organic silicon compound, etc.

Method of Manufacturing Silica Layers and an Antireflection Film Using the Same:

Next, a method of manufacturing the antireflection film of the present invention will be described.

In the present invention, as long as an antireflection multilayered article such as mentioned above can be formed, the method of manufacturing the antireflection film is not particularly limited. For example, one can employ any method, such as a vacuum evaporation method, a sputtering method, a thermal CVD method, or wet coating based on a sol-gel method, etc.

Among the above methods, it is preferable to use the plasma CVD method for manufacturing the silica layers and the antireflection film of the present invention.

Here, the plasma CVD method refers to a film-forming method utilizing a phenomenon in which a plasma is generated within a reaction chamber into which a predetermined gas is introduced, to generate atomic or molecular radical species, which are then adhered to the solid surface and further desorb volatile molecules through their surface reaction in many cases, to be incorporated on the solid surface. By forming the antireflection film of the present invention with the plasma CVD method, a plurality of layers can be collectively formed efficiently. In terms of power application, the plasma CVD method comes in two types: a plasma CVD method based on capacitive coupled plasma, and a plasma CVD method based on inductive coupled plasma, either of which can be employed in the present invention.

Figure 3:
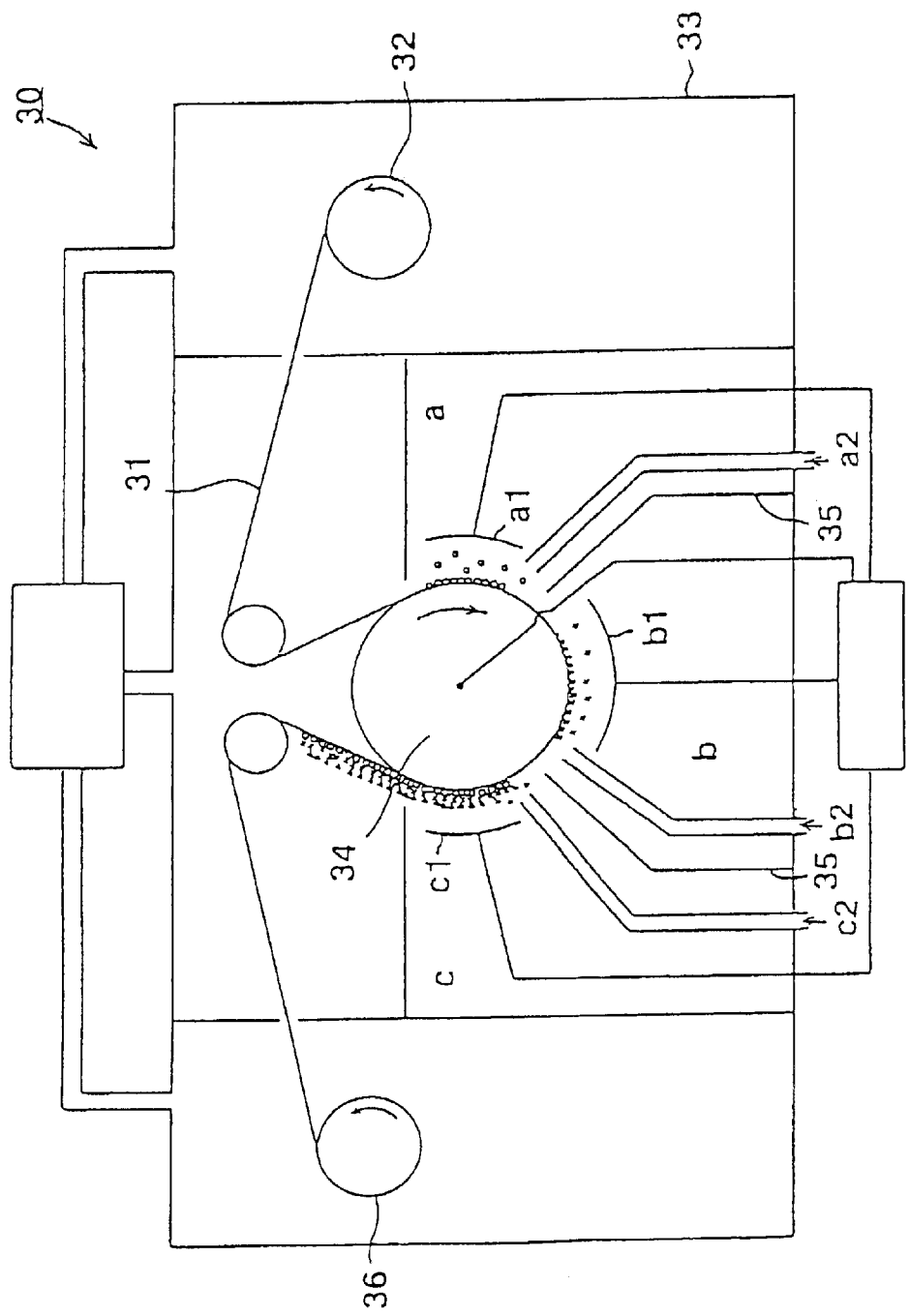
FIG. 3 is a schematic sectional view of a plasma CVD system for producing silica layers and an antireflection film of the present invention.

Here, of the above types of the plasma CVD method, it is particularly preferable to use a plasma CVD system such as shown in FIG. 3, because this plasma CVD system permits serial manufacture of the antireflection film of the present invention, and accurate control over the temperature of the polymeric film, which is the substrate.

The plasma CVD system 30 shown in FIG. 3 is a plasma CVD system based on capacitive coupled plasma where a web-like polymeric film 31 is rolled off from a substrate roll-off section 32 for feeding into reaction chambers (a, b, c) in a vacuum container 33. Then, predetermined layers are formed on a layer-forming drum 34 within the respective reaction chambers, and the thus layer-formed substrate is then rewound by a substrate rewinding section 36.

This plasma CVD system 30 has a feature that a plurality (three) of reaction chambers are arranged. The respective reaction chambers (a, b, c) are formed while partitioned by partition walls 35. Here, for purposes of explanation to be given below, the three reaction chambers are denoted as the reaction chamber a, the reaction chamber b, and the reaction chamber c from the right-hand end. The reaction chambers are provided with electrode plates a1, b1, c1 and source gas inlets a2, b2, c2, respectively. The reaction chambers (a, b, c) are provided along the outer periphery of the layer-forming drum 34. This is because the polymeric film for forming the antireflection multilayered article is supplied into the reaction chambers in synchronism with the rotation of the layer-forming drum 34 for formation of the antireflection multilayered article on the layer-forming drum, whereby the respective layers can be layered serially when such a layout is adopted.

According to a plasma CVD system such as mentioned above, by feeding different source gases into the respective chambers, the layers can be formed independently inside the respective chambers.

For example, in the antireflection film 1 shown in FIG. 1, first, the hard coating layer 7 is formed on, for example, a PET film 2 as the substrate by a conventional wet coating technique, and the medium and high refractive index layers 6 and 5, both of which are carbon-containing silica layers, and the silica layer 4 composed of an organic silicon compound as the outermost layer can be formed thereafter by the plasma CVD system 30. That is, by feeding silicon-containing gases as raw materials for the respective layers into the reaction chambers a, b, c, the antireflection film 1 can be formed, in which the silica layers as medium and high refractive index layers and the silica layer (low refractive index layer) as the outermost layer are formed on the polymeric film 31, by the time the polymeric film 31 passing over the layer-forming drum 34, is rewound onto the substrate rewinding section 46.

In manufacturing the antireflection film 1 of the present invention using the plasma CVD system shown in FIG. 3, organic silicones are preferable as the raw materials for forming the silica layers (low, medium, and high refractive index layers) constituting the antireflection multilayered article 3. Specifically, these raw materials include hexamethyldisiloxane (HMDSO), tetramethyldisiloxane (TMDSO), methyltrimethoxysilane (MTMOS), methylsilane, dimethylsilane, trimethylsilane, diethylsilane, propylsilane, phenylsilane, tetramethoxysilane, octamethylcyclotetrasiloxane, tetraethoxysilane, etc.

It should be noted that the present invention is not limited to the above-mentioned antireflection film and its manufacturing method. The above embodiments are illustrative, and therefore, any embodiment having substantially the same arrangement as and providing similar effects and advantages to the technical scope recited in the appended claims will be included in the technical scope of the present invention.

EXAMPLES

The present invention will be described in detail with reference to examples thereof.

Silica Layer Composed of an Organic Silicon Compound and Functioning as a Low Refractive Index Layer

Example 1

A silica layer was formed on a substrate using the system of FIG. 3 as an example of the present invention. For its formation, only the reaction chamber a was used, because the layer to be formed is only a silica layer composed of an organic silicon compound and functioning as a low refractive index layer. The conditions under which the silica layer was formed are shown below.

(Layer-Forming Conditions)

Source gas: $(CH_3)_3SiOSi(CH_3)_3+O_2$
Plasma generation means: RF wave at 13.56 MHz
Substrate: PET film (trade name: "Lumirror T60" manufactured by Toray)

Under the above conditions, the silica layer having the following properties was formed on the substrate.

Refractive index: 1.43
Composition: $SiO_{1.6}C_{0.5}$: H
Infrared absorption due to C—H stretching vibrations: 0.7 $cm^{-1}$
Infrared absorption due to O—H stretching vibrations: 5.2 $cm^{-1}$ It should be noted that a photoelectron spectrometer was used for the composition analysis, that an infrared spectrometer was used for the measurement of infrared absorptions, and that an ultraviolet-visible spectrometer and an ellipsometer were used for the measurement of optical properties.

Then, the refractive index of the above silica layer was measured again after the layer was stood at 80° C. and 90% relative humidity for 1000 hours (humidity/heat resistance test) using an environmental test machine. The result is shown below. Refractive index after the humidity/heat resistance test: 1.43

Comparative Example 1

As a comparative example to the present invention, a silica layer was formed using a known vacuum evaporation system, under the following conditions.
(Layer-Forming Conditions)

Evaporation source: $SiO_2$
Means for vaporizing the source: Electron gun
Substrate: PET film (Trade name: "Lumirror T60" manufactured by Toray)

Under the above conditions, the silica layer having the following properties was formed.

Refractive index: 1.42
Composition: $SiO_{1.8}C_{0.1}$: H
Infrared absorption due to C—H stretching vibrations: 0 $cm^{-1}$
Infrared absorption due to O—H stretching vibrations: 7 $cm^{-1}$ It should be noted that the photoelectron spectrometer was used for the composition analysis, that the infrared spectrometer was used for the measurement of infrared absorptions, and that the ultraviolet-visible spectrometer and the ellipsometer were used for the measurement of optical properties.

Then, the refractive index of the above silica layer was measured again after the layer was stood at 80° C. and 90% relative humidity for 1000 hours (humidity/heat resistance test) using the environmental test machine. The result is shown below. Refractive index after the humidity/heat resistance test: 1.44

From the above results, it has become clear that the example of the present invention exhibits a low refractive index and is thus preferable as the outermost layer of an antireflection multilayered article in an antireflection film, and even has humidity/heat resistance. On the other hand, the comparative example exhibits a lower refractive index than the example of the present invention before the humidity/heat resistance test, but the silica layer of the comparative example is very porous compared to the silica layer of the example of the present invention, and hence has no practicability as an antireflection film. Further, the refractive index of the comparative example underwent a change by 0.02 after the humidity/heat resistance test.

Carbon-Containing Silica Layer Functioning as a High or Medium Refractive Index Layer

Example 2

A silica layer was formed using the system of FIG. 3 as an example of the present invention. For its formation, only the reaction chamber a was used, because the layer to be formed is only a carbon-containing silica layer. The conditions under which the silica layer was formed are shown below.
(Layer-Forming Conditions)

| | |
|---|---|
| Source gas: | HMDSO($(CH_3)_3SiOSi(CH_3)_3$), $O_2$, He |
| Plasma excitation frequency: | 40 kHz |
| Substrate: | PET film (trade name "Lumirror T60" manufactured by Toray) |
| HMDSO flowrate: | 1 slm |
| $O_2$ gas flowrate: | 1 slm |

-continued

| | |
|---|---|
| He gas flowrate: | 0.5 slm |
| Power: | 1 kW |
| Layer-forming pressure: | 9.3 Pa |
| Layer-forming rate: | 1.2 μm · m/min |

Example 3

A silica layer of the present invention was formed similarly to Example 2 except for the following conditions.
(Layer-Forming Conditions Different from those of Example 2)

| | |
|---|---|
| $O_2$ gas flowrate: | 0.5 slm |
| Power: | 1.5 kW |
| Layer-forming pressure: | 6.7 Pa |

Example 4

A silica layer of the present invention was formed similarly to Example 2 except for the following conditions.
(Layer-Forming Conditions Different from those of Example 2)

| | |
|---|---|
| $O_2$ gas flowrate: | 0 slm |
| Power: | 3 kW |
| Layer-forming pressure: | 2.7 Pa |

Example 5

A silica layer of the present invention was formed similarly to Example 2 except for the following conditions.
(Layer-Forming Conditions Different from those of Example 2)

| | |
|---|---|
| $O_2$ gas flowrate: | 0.2 slm |
| Power: | 2 kW |
| Layer-forming pressure: | 3.3 Pa |

Comparative Example 2

A silica layer of a comparative example to the present invention, was formed similarly to Example 2 except for the following conditions.
(Layer-Forming Conditions Different from those of Example 2)

| | |
|---|---|
| Source gas: | TMS (tetramethylsilane), $O_2$, He |
| TMS flowrate: | 1 slm |
| $O_2$ gas flowrate: | 0.2 slm |
| Power: | 3 kW |
| Layer-forming pressure: | 4.0 Pa |

Comparative Example 3

A silica layer of a comparative example to the present invention, was formed similarly to Example 2 except for the following conditions.
(Layer-Forming Conditions Different from those of Example 2)

Source gas: TMOS (tetramethoxysilane), $O_2$, He
TMOS flowrate: 1 slm

Comparative Example 4

A silica layer of a comparative example to the present invention was formed under the following conditions using a known winding type sputtering system.
(Layer-Forming Conditions)

| | |
|---|---|
| Target: | p-Si |
| Feed gases: | $O_2$, Ar |
| $O_2$ gas flowrate: | 50 sccm |
| Ar gas flowrate: | 450 sccm |
| Power: | 3 kW |
| Layer-forming pressure: | 3 mTorr |
| Layer-forming rate: | 20 nm · m/min |

As to the thus formed silicon layers of the present invention which are Examples 2 to 5 and Comparative Examples 2 to 4, their compositions, refractive indices n (λ=550 nm), and extinction coefficients k (λ=550 nm) are shown in Table 1 below. It should be noted that the photo-electron spectrometer was used for the composition analysis, that the infrared spectrometer was used for the understanding of chemical bonding in the silica layers, and that the ultraviolet-visible spectrometer and the ellipsometer were used for the measurement of optical properties.

TABLE 1

| | Composition ($SiO_xC_y$) | | | |
|---|---|---|---|---|
| | Value of x (number of oxygen atoms) | Value of y (Number of carbon atoms) | Refractive index n | Extinction coefficient k |
| Example 2 | 1.6 | 0.3 | 1.55 | 0.00089 |
| Example 3 | 1.6 | 1.0 | 1.64 | 0.0045 |
| Example 4 | 0.5 | 1.8 | 2.45 | 0.017 |
| Example 5 | 0.5 | 1.0 | 1.97 | 0.014 |
| Comparative Example 2 | 0.3 | 1.0 | 2.22 | 0.052 |
| Comparative Example 3 | 1.8 | 0.1 | 1.46 | 0.00021 |
| Comparative Example 4 | 1.0 | 1.0 | 1.95 | 0.034 |

As can be understood also from Table 1, the silica layers according to Examples 2 and 3 have refractive indices suitable for medium refractive index layers, and so do the silica layers according to Examples 4 and 5 for high refractive index layers. It is also understood that each of the silica layers according to Examples 1 to 4 has an extinction coefficient of 0.018 or less, and hence has an excellent transparency.

On the other hand, it is understood that the silica layer according to Comparative Example 2 has a refractive index which is within the preferable range as a high refractive index layer, but that the number of oxygen atoms in its composition is as small as 0.3. Therefore, the percentage of Si—Si bonds in the layer is so large that its extinction coefficient is 0.018 or more. Hence, it has become clear that this silica layer lacks transparency.

Further, it is understood that the silica layer according to Comparative Example 3 has a number of carbon atoms C in its composition which is as small as 0.1. Therefore, this silica layer is analogous to a layer of pure silicon dioxide ($SiO_2$) having a small refractive index. Hence, it has become clear that a layer is usable neither as a medium nor high refractive index layer.

Still further, the silica layer according to Comparative Example 4 was formed by using the winding type sputtering system, and thus its refractive index is within the preferable range as a high refractive index layer, but its extinction coefficient is 0.018 or more, which makes it clear that this silica layer lacks transparency.

Antireflection Film Using Silica Layers

Example 6

The antireflection film 1 shown in FIG. 1 was formed as an example of the present invention using the system of FIG. 3. For its formation, the carbon-containing silica layer 6 as a medium refractive index layer was formed in the reaction chamber a, the carbon-containing silica layer 5 as a high refractive index layer was formed in the reaction chamber b, and the silica layer composed of an organic silicon compound as a low refractive index layer was formed in the reaction chamber a, whereby the three layers were sequentially layered at a time. The conditions inside the respective reaction chambers are shown below.

(Reaction Chamber a: Formation of the Silica Layer as a Medium Refractive Index Layer)

| Source gas: | $(CH_3)_3SiOSi(CH_3)_3 + O_2$ |
|---|---|
| source gas flowrate: | 1 slm |
| $O_2$ gas flowrate: | 0.3 slm |
| He gas flowrate: | 1.0 slm |
| Power: | 1 kW |
| Pressure: | 3 Pa |

Plasma generation means: RF waves at 13.56 MHz
(Reaction Chamber b: Formation of the Silica Layer as a High Refractive Index Layer)

| Source gas: | $(CH_3)_3SiOSi(CH_3)_3 + O_2$ |
|---|---|
| source gas flowrate: | 1 slm |
| $O_2$ gas flowrate: | 0 slm |
| He gas flowrate: | 1 slm |

Plasma generation means: RF waves at 13.56 MHz
(Reaction Chamber c: Formation of the Silica Layer as a Low Refractive Index Layer)

| Source gas: | $(CH_3)_3SiOSi(CH_3)_3 + O_2$ |
|---|---|
| source gas flowrate: | 1.0 slm |
| $O_2$ gas flowrate: | 3.0 slm |
| Layer-forming rate: | 0.25 μm · m/min |
| Plasma generation means: | RF waves at 13.56 MHz |

Further, a PET film (trade name: "Lumirror T60" manufactured by Toray) was used as the substrate 2, and a hard coating layer was layered on the substrate by wet coating before superposing the antireflection multilayered article using the plasma CVD system.
(Properties of the Antireflection Film)

The antireflection film 1 shown in FIG. 1 was formed under the above conditions.

The silica layer 4 composed of an organic silicon compound (layered at the reaction chamber c) as the outermost layer of the antireflection multilayered article 3 in the antireflection film 1 has the following properties.

Refractive index: 1.43
Composition: $SiO_{1.6}C_{0.5}$: H
Infrared absorption due to C—H stretching vibrations: 0.7 $cm^{-1}$
Infrared absorption due to O—H stretching vibrations: 5.2 $cm^{-1}$ The photoelectron spectrometer was used for the composition analysis, the infrared spectrometer was used for measurement of infrared absorptions, and the ultraviolet-visible spectrometer and the ellipsometer were used for the measurement of optical properties.

Then, the refractive index of the silica layer 4 composed of an organic silicon compound was measured again after the antireflection film 1 was stood at 80° C. and 90% relative humidity for 1000 hours (humidity/heat resistance test) using the environmental test machine. The result is shown below. Refractive index after the humidity/heat resistance test: 1.43

From the above, it has become clear that the silica layer 4 composed of an organic silicon compound as the outermost layer of the antireflection multilayered article 3 in the antireflection film 1 of the present invention exhibits a small refractive index and thus suitable for the outermost layer, and even has humidity/heat resistance.

Further, the carbon-containing silica layer 6 (layered at the reaction chamber a) as a medium refractive index layer in the antireflection multilayered article 3 of the antireflection film 1 has the following properties.

Refractive index: 1.76 (λ=550 nm)
Composition: $SiO_{0.9}C_{1.2}$
Extinction coefficient: 0.0042

The photoelectron spectrometer was used for the composition analysis, the infrared spectrometer was used for the understanding of chemical bonding in the silica layer, and the ultraviolet-visible spectrometer and the ellipsometer were used for the measurement of optical properties.

From the above results, it has become clear that the carbon-containing silica layer 6 formed in this example has a refractive index suitably usable as a medium refractive index layer of the antireflection multilayered article in the antireflection film, and is excellent in transparency due to its small extinction coefficient.

Further, the carbon-containing silica layer 5 (stacked in the reaction chamber b) as a high refractive index layer in the antireflection multilayered article 3 of the antireflection film 1 has the following properties.

Refractive index: 2.10 (λ=550 nm)
Composition: $SiO_{0.7}C_{1.5}$
Extinction coefficient: 0.0008 (λ=550 nm)

It should be noted that the photoelectron spectrometer was used for the composition analysis, that the infrared spectrometer was used for the understanding of chemical bonding in the silica layer, and that the ultraviolet-visible spectrometer and the ellipsometer were used for the measurement of optical properties.

From the above results, it has become clear that, similarly to the silica layer 6 as a medium refractive index layer, the carbon-containing silica layer 5 formed in this example has a refractive index suitably usable as a high refractive index layer of the antireflection multilayered article in the antireflection film, and is excellent in transparency due to its small extinction coefficient.

Further, by using a silica layer to form every layer of the antireflection multilayered article 3 in the antireflection film 1 as in the above example, an antireflection film exhibiting good antireflection performance, transparency, and adhesion between layers was obtained.

In the antireflection multilayered article of the antireflection film of the present invention, a silica layer composed of an organic silicon compound is used as its outermost layer, and at least one carbon-containing silica layer is formed internally from the outermost layer, whereby the outermost layer has bondings to organic moieties, such as methyl group ($CH_3$—), in addition to bondings between silicon atoms (Si) and oxygen atoms (O) which are its essential constituents, and hence the outermost layer can have a small refractive index without providing voids therein. Further, due to the absence of voids, the silica layer of the present invention has superior performance with respect to humidity/heat resistance.

Further, the carbon-containing silica layer forming the antireflection multilayered article can be used as the so-called medium or high refractive index layer by setting its refractive index between 1.55 and 2.50 ($\lambda$=550 nm). Still further, this carbon-containing silica layer is made from the same silicon oxide ($SiO_x$) as that of the silica layer used as the outermost layer, and hence can improve the yield of forming the antireflection multilayered article, reduce cost, and can even improve adhesion between the layers forming the antireflection multilayered article. Also, this carbon-containing silica layer has an extinction coefficient of 0.018 ($\lambda$=550 nm) or less, and thus is sufficiently transparent, whereby it can be suitably used as a layer in an antireflection multilayered article for forming an antireflection film applied to various displays, such as liquid-crystal displays, and plasma displays, for example.

What is claimed is:

1. An antireflection film comprising a substrate film and an antireflection multiple layer provided on the substrate film, wherein the antireflection multiple layer comprises an organic silicon layer (A) having a composition represented by $SiO_xC_y$:H (x=1.6 to 1.9 and y=0.2 to 1.0) and a refractive index of not less than 1.40 and not more than 1.46 ($\lambda$=550 nm) as an outer layer and at least one layer selected from a silicon oxycarbide layer (B) having a composition represented by $SiO_aC_b$ (a=0.7 to 1.7 and b=0.2 to 1.4) and a refractive index of not less than 1.55 and less than 1.80 ($\lambda$=550 nm) and a silicon oxycarbide layer (C) having a composition represented by $SiO_dC_e$ (d=0.5 to 0.9 and e=1.0 to 2.0) and a refractive index of not less than 1.80 and not more than 2.50 ($\lambda$=550 nm) provided between the substrate and the outer layer.

2. An antireflection film according to claim 1, wherein the antireflection multiple layer comprises said silicon oxycarbide layer (B), said silicon oxycarbide layer (C), and said organic silicon layer (A), in order from a side of the substrate film.

3. An antireflection film according to claim 1, wherein the antireflection multiple layer comprises said silicon oxycarbide layer (C), said organic silicon layer (A), another silicon oxycarbide layer (C), and another organic silicon layer (A), in order from a side of the substrate film.

* * * * *